(12) United States Patent
Kobayashi et al.

(10) Patent No.: US 11,377,594 B2
(45) Date of Patent: Jul. 5, 2022

(54) PHOSPHOR AND LIGHT-EMITTING DEVICE

(71) Applicant: DENKA COMPANY LIMITED, Tokyo (JP)

(72) Inventors: Keita Kobayashi, Omuta (JP); Shunsuke Mitani, Omuta (JP); Ryousuke Kondo, Omuta (JP); Kazuya Sugita, Omuta (JP); Takuya Matsufuji, Omuta (JP); Akihisa Kajiyama, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/272,827

(22) PCT Filed: Aug. 22, 2019

(86) PCT No.: PCT/JP2019/032907
§ 371 (c)(1),
(2) Date: Mar. 2, 2021

(87) PCT Pub. No.: WO2020/054350
PCT Pub. Date: Mar. 19, 2020

(65) Prior Publication Data
US 2021/0189234 A1    Jun. 24, 2021

(30) Foreign Application Priority Data

Sep. 12, 2018 (JP) .............................. JP2018-170866

(51) Int. Cl.
| | |
|---|---|
| *C09K 11/77* | (2006.01) |
| *C01B 21/082* | (2006.01) |
| *C09K 11/64* | (2006.01) |
| *H01L 33/50* | (2010.01) |

(52) U.S. Cl.
CPC ...... *C09K 11/77348* (2021.01); *C01B 21/082* (2013.01); *C09K 11/64* (2013.01); *H01L 33/502* (2013.01); *H01L 33/50* (2013.01)

(58) Field of Classification Search
CPC .......... C09K 11/7734; C09K 11/77342; C09K 11/77344; C09K 11/77346; C09K 11/77347; C09K 11/77348
See application file for complete search history.

(56) References Cited

U.S. PATENT DOCUMENTS

| | | | | |
|---|---|---|---|---|
| 2010/0053932 A1* | 3/2010 | Emoto | ............... | C09K 11/0883 362/84 |
| 2010/0176713 A1 | 7/2010 | Hanamoto et al. | | |
| 2012/0211700 A1 | 8/2012 | Ichikawa et al. | | |
| 2017/0309795 A1* | 10/2017 | Kim | ...................... | H01L 33/56 |

FOREIGN PATENT DOCUMENTS

| | | |
|---|---|---|
| JP | 4769132 B2 | 9/2011 |
| JP | 2012-052127 A | 3/2012 |
| JP | 2012-056804 A | 3/2012 |
| JP | 5368985 B2 | 12/2013 |
| JP | 5508817 B2 | 6/2014 |
| WO | 2012/033157 A1 | 3/2012 |

OTHER PUBLICATIONS

Mar. 9, 2021 Internaional Preliminary Reporton Patentability issued in International Patent Application No. PCT/JP2019/032907.
Oct. 8, 2019 Search Report issued in International Patent Application No. PCT/JP2019/032907.

* cited by examiner

*Primary Examiner* — Matthew E. Hoban
(74) *Attorney, Agent, or Firm* — Oliff PLC

(57) ABSTRACT

A β-type sialon phosphor represented by the following expression 1, in which D50 is 10 μm or less, and values of D10, D50, and D90 satisfy a relationship of the following expression 2 with respect to D10, D50, and D90 (each unit is [μm]) on a volume frequency basis as measured according to a laser diffraction/scattering method. Expression 1: $Si_{12-a}Al_aO_bN_{16-b}:Eu_x$ (wherein $0<a\le3$; $0<b\le3$; $0<x\le0.1$), expression 2: $(D90-D10)/D50<1.6$ (wherein the D10, D50, and D90 (each unit is [μm]) on a volume frequency basis as measured according to the laser diffraction/scattering method.

4 Claims, No Drawings

PHOSPHOR AND LIGHT-EMITTING DEVICE

TECHNICAL FIELD

The invention relates to a phosphor for use in LED (Light Emitting Diode) and a light-emitting device using the phosphor.

BACKGROUND ART

A widely known light-emitting device is a LED package (also simply referred to as "LED") where white light is obtained by combining a blue LED with a green phosphor, a red phosphor, and the like (Patent Literature 1). A commonly known method for producing such a phosphor is, for example, a production method involving performing a step of mixing and firing phosphor raw materials, and subsequently performing a re-firing or annealing treatment at a lower temperature than the firing temperature in the firing step, in an inert atmosphere or a reducing atmosphere, or in vacuum (Patent Literature 2). It is also known to improve fluorescence properties of a phosphor by performing a re-firing or annealing treatment at a lower temperature than the firing temperature in the firing step. It is also known to be able to improve luminance of a light-emitting device by controlling the particle form of a phosphor (Patent Literature 3).

CITATION LIST

Patent Literatures

Patent Literature 1: Japanese Patent Publication No. 4769132
Patent Literature 2: Japanese Patent Publication No. 5508817
Patent Literature 3: Japanese Patent Publication No. 5368985

SUMMARY OF INVENTION

Technical Problem

Development for downsizing and thinning liquid crystal displays has recently increasingly progressed, and LEDs for use in backlights of such liquid crystal displays have also been demanded to be further downsized and thinned (for example, mini LEDs and micro LEDs). Development of, for example, phosphor sheets, phosphor plates, and the like including phosphors, for displays and light-emitting devices having novel structures, has also progressed (in the invention, the above may be collectively called "downsized and thinned fluorescence-emitting device"). Phosphors for use in such downsized and thinned fluorescence-emitting devices are also demanded to be downsized, namely, decreased in particle size in order to deal with development and production of such fluorescence-emitting devices. For example, a downsized LED package, which is simply increased in suitability of phosphor particle size for LED, is not satisfactory, and any phosphor disproportionally large in particle size to the size of LED not only easily causes either the variation in LED brightness or the deviation of chromaticity to occur, but also is reduced in yield in production thereof, and therefore a phosphor decreased in particle size is demanded from such viewpoints. However, a phosphor unnecessarily decreased in particle size tends to be degraded in light-emitting characteristics and reduced in brightness.

Accordingly, there is demanded a novel technique for providing a phosphor which, even if decreased in particle size, is neither degraded in light-emitting characteristics nor reduced in brightness.

Solution to Problem

An object of the invention is to provide a β-type sialon phosphor where the D50 is 10 μm or less, and the conversion efficiency of the wavelength of excitation light (for example, monochromatic light at 455 nm) to the phosphor to another wavelength, namely, the internal quantum efficiency of the phosphor, and the light absorptivity (the proportion of the excitation light absorbed by the phosphor) are high. Another object thereof is to provide a light-emitting device including the phosphor of the invention.

The present inventors have made intensive studies, and as a result, have found that the above problems may be solved by a phosphor which is decreased in particle size and thus formed into a fine powder, in which the proportion of any powder (hereinafter, referred to as "ultrafine powder") located in a small size distribution region is particularly reduced, and have completed the invention. That is, the invention may provide the following.

(1) A β-type sialon phosphor represented by the following expression 1, wherein D50 is 10 μm or less, and values of D10, D50, and D90 satisfy a relationship of the following expression 2 with respect to D10, D50, and D90 (each unit is [μm]) on a volume frequency basis as measured according to a laser diffraction/scattering method:

$$Si_{12-a}Al_aO_bN_{16-b}:Eu_x \qquad \text{Expression 1}$$

wherein $0<a\leq3$; $0<b\leq3$; $0<x\leq0.1$ $$(D90-D10)/D50<1.6 \qquad \text{Expression 2}$$

wherein the D10, D50, and D90 (each unit is [μm]) on a volume frequency basis as measured according to the laser diffraction/scattering method are each a measurement value obtained with a liquid obtained by loading 0.5 g of a phosphor for measurement, into 100 ml of a solution of 0.05% by weight of sodium hexametaphosphate mixed in ion-exchange water, and subjecting the resultant to a dispersing treatment for 3 minutes with an ultrasonic homogenizer at an oscillation frequency of 19.5±1 kHz and an amplitude of vibration of 32±2 μm, with a chip being placed at a central portion of the liquid.

(2) The β-type sialon phosphor according to (1), wherein a diffuse reflectivity of light at a wavelength of 800 nm is 95% or more.

(3) The β-type sialon phosphor according to (1) or (2), wherein a light absorptivity of light at a wavelength of 600 nm is 6% or less.

(4) The β-type sialon phosphor according to any one of (1) to (3), wherein an average particle size $D_{BET}$ [μm] calculated from a specific surface area measured according to a BET method and the D50 [μm] measured according to a laser diffraction/scattering method, of the β-type sialon phosphor, satisfy a relationship of the following expression 3:

$$D50/D_{BET}<2.1. \qquad \text{Expression 3}$$

(5) A light-emitting device including a LED, a phosphor sheet, or a phosphor plate including the β-type sialon phosphor according to any one of (1) to (4).

Advantageous Effects of Invention

The invention may be carried out to thereby provide a β-type sialon phosphor which, while the D50 is 10 μm or less, is high in internal quantum efficiency and light absorptivity. A light-emitting device using the phosphor of the invention may be provided. The β-type sialon phosphor of the invention may also be preferably used for production of a downsized and thinned fluorescence-emitting device.

DESCRIPTION OF EMBODIMENTS

Hereinafter, the invention will be described with reference to specific embodiments, but the scope of the invention is not limited to any specific embodiment.

β-Type Sialon Phosphor and Light-Emitting Device

The phosphor of the invention is a β-type sialon phosphor represented by formula of $Si_{12-a}Al_aO_bN_{16-b}:Eu_x$ (wherein $0 < a \leq 3$; $0 < b \leq 3$; $0 < x \leq 0.1$).

In a case where the phosphor of the invention is used in a LED, a phosphor sheet, or a phosphor plate, the phosphor of the invention is generally dispersed in a silicone-based or epoxy-based resin, or a ceramic through which transparent or visible light passes, and thus is used. While the β-type sialon phosphor of the invention may also be preferably used for production of, for example, a micro LED having a size of about several tens μm, or a downsized and thinned fluorescence-emitting device such as a phosphor sheet having a thickness of several tens μm, the D50 on a volume frequency basis as measured according to a laser diffraction/scattering method is required to be 10 μm or less. Herein, the D50 means a particle size at a cumulative volume of 50% from a small particle size side in a particle size distribution curve, and is also referred to as a median size. If the D50 is more than 10 μm, for example, the variations in amount of the phosphor included and in dispersion state thereof in production of a micro LED tend to be easily caused and the variations in color and brightness of the LED tend to be increased, resulting in a remarkable reduction in product yield in some cases.

The β-type sialon phosphor of the invention is required to allow the D10, D50, and D90 (each unit is [μm], and D50 here is the same as the median size D50) on a volume frequency basis as measured according to a laser diffraction/scattering method to satisfy the expression of (D90−D10)/D50<1.6.

While a conventional β-type sialon phosphor, when the D50 on a volume frequency basis as measured according to a laser diffraction/scattering method is about 10 to 30 μm, has been considered to be good in crystallinity of such a β-type sialon phosphor and suitable also for an enhancement in LED brightness, the D90 is 30 to 50 μm and the D100 is a size closer to 100 μm in such a phosphor. In the invention, a powder (particle) having a particle size of more than 50 μm may also be referred to as "coarse powder" in the present specification. The D10 means a particle size at a cumulative volume of 10% from a small particle size side in a particle size distribution curve, the D90 means a particle size at a cumulative volume of 90% from a small particle size side in a particle size distribution curve, and the D100 means a particle size at a cumulative volume of 100% from a small particle size side in a particle size distribution curve.

The D100 on a volume frequency basis as measured according to a laser diffraction/scattering method of a phosphor is generally preferably suppressed to a size of one third or less of the inner diameter of a charging nozzle of about several tens μm or the aperture of a screen printing mesh in order to allow a phosphor-dispersed resin or transparent material to stably pass through the nozzle or the screen printing mesh in the course of production of a phosphor sheet having a thickness of about several tens μm or production of a downsized and thinned fluorescence-emitting device such as a LED having a size of about several tens μm, which are currently progressively developed. A size of more than one third easily causes nozzle clogging and/or mesh clogging to occur, and thus a downsized and thinned fluorescence-emitting device is difficult to industrially produce.

The method for providing the β-type sialon phosphor of the invention is not particularly limited. There may be adopted a method for synthesizing such a phosphor with an increase in phosphor particle size being controlled so that neither a coarse powder nor an ultrafine powder is produced whenever possible, or, for example, a method involving pulverizing a fired product (phosphor which has a larger D50 than that of the β-type sialon phosphor of the invention, or which is aggregated) obtained by firing a raw material powder, by use of a mechanical unit.

In a case where the D50 is tried to reach 10 μm or less according to the latter method, strong pulverization is generally required, resulting in an increase in proportion of an ultrafine powder having relatively many crystal defects in the phosphor, and a reduction in internal quantum efficiency. Such an ultrafine powder is large in specific surface area and thus causes increased reflection (light absorbed by the phosphor is decreased), resulting in a tendency to reduce the rate of absorption of excitation light. In the latter method, for example, a strong pulverization treatment is performed and then an ultrafine powder included is removed in order to obtain a β-type sialon phosphor including an ultrafine powder in a small amount as much as possible, and therefore the phosphor as a whole is suppressed in reflection and more increased in excitation light absorbed. An ultrafine powder having many defects is removed, and therefore a high internal quantum efficiency is obtained and a β-type sialon phosphor preferably used for a downsized and thinned fluorescence-emitting device is obtained.

The method for removing a coarse powder and an ultrafine powder from the β-type sialon phosphor is also not particularly limited. In general, a coarse powder and an ultrafine powder may be removed by using a mechanical sieve or by decantation with the difference in precipitation rate in a liquid medium (preferably water) depending on the particle size. A liquid cyclone utilizing a principle where the difference in particle size provides the difference in centrifugal force, a swirling airflow type classifier using a force of wind, or other known apparatus may be applied. In a case where solid liquid separation is made during such operations, filtration may be made with filter paper or a membrane filter, or a dewatering apparatus or solid liquid separation apparatus utilizing a centrifugal force may also be applied. Such apparatuses and units may be appropriately combined and/or repeatedly operated.

While the D50 of the β-type sialon phosphor of the invention is set to be 10 μm or less, in addition, a coarse powder causing any failure in the course of production of a downsized and thinned fluorescence-emitting device and an ultrafine powder having an influence on brightness of the phosphor are required to be set so as to be included in small amounts as much as possible, and the β-type sialon phosphor of the invention is required to satisfy the relationship of (D90−D10)/D50<1.6 from the above viewpoint. That is, it is indicated that the difference between D90 and D10 relative to a value of D50 is less than a certain value, and therefore it is indicated that there are small amounts of a particle having a size smaller than D10 and a particle having a size larger than D90. In the invention, the D50 is 10 μm or less, and thus a particle small as compared with that of D10 means a particle having a particle size of several μm to submicron or less. In the invention, when a relationship of (D90−D10)/D50<1.6 is satisfied, the proportion of a fine powder (herein, particularly a particle of 0.2 μm or less is defined as an "ultrafine powder") having an adverse influence on characteristics of the β-type sialon phosphor naturally decreases.

The value of (D90−D10)/D50 is generally a value serving as an index indicating the degree of spreading of a particle size distribution, and a value of 1.6 or more causes the proportion of the ultrafine powder to entirely increase to thereby cause the problems of an increase in specific surface area, increases of reflection and scattering, and a reduction in rate of absorption of excitation light. A large amount of the ultrafine powder may cause many defects due to pulverization and/or may cause inferior crystallinity, and a problem caused is that the internal quantum efficiency is reduced. A large span value decreases D10 relative to D50 and increases the proportion of the ultrafine powder, and causes light to be scattered or reflected by the ultrafine powder in LED formation and causes light to migrate in such a LED before emission of light outside such a LED, thereby resulting in light attenuation (change to heat or the like) by a reflector, a resin, and/or the like to easily cause the brightness of the entire LED to be reduced. Such a tendency is again observed also in a phosphor sheet produced by mixing the phosphor and a resin. In a case where the phosphor sheet is irradiated with blue excitation light to measure transmitted light and fluorescence of the excitation light emitted from opposite, and the proportion of the fluorescence emitted relative to the excitation light for irradiation is compared, a phosphor which is large in span value, namely, which includes a large amount of the ultrafine powder is reduced in proportion of the fluorescence relative to the excitation light.

In a case where the particle size of a powder is measured according to a laser diffraction/scattering method, it is important to eliminate aggregation of the powder before the measurement to thereby sufficiently disperse the powder in a dispersion medium. Since any differences in dispersion conditions sometimes lead to any difference in measurement value, the measurement values of D10, D50, D90, and the like of the β-type sialon phosphor of the invention according to a laser diffraction/scattering method are defined as measurement values obtained with a liquid obtained by loading 0.5 g of a phosphor for measurement into 100 ml of a solution of 0.05% by weight of sodium hexametaphosphate mixed in ion-exchange water, and subjecting the resultant to a dispersing treatment for 3 minutes with an ultrasonic homogenizer at an oscillation frequency of 19.5±1 kHz, a chip size of 20φ, and an amplitude of vibration of 32±2 μm, with a chip being placed at a central portion of the liquid, according to JIS R1622 and R1629. A designation of 19.5±1 represents the range of 18.5 or more and 20.5 or less, and a designation of 32±2 represents the range of 30 or more and 34 or less.

The β-type sialon phosphor of the invention is defined, besides the provision concerning the particle size thereof, as follows: the diffuse reflectivity of light at a wavelength of 800 nm of the β-type sialon phosphor is preferably 95% or more. That is, in a case where the diffuse reflectivity is confirmed by irradiating the phosphor with, for example, light at a wavelength of 800 nm not naturally absorbed by Eu as an activation element of the β-type sialon phosphor, excessive light absorption by crystal defects of the phosphor and/or a compound (also referred to as "heterophase") other than the β-type sialon phosphor of the invention may be confirmed. For example, while a phosphor small in particle size is obtained by strongly performing mechanical pulverization, crystal defects on the surface increase at the same time, and in this case, light at a wavelength of 800 nm is also absorbed by such defects and thus there is a phenomenon where the diffuse reflectivity is reduced to less than 95%.

The β-type sialon phosphor of the invention is defined, besides the provision concerning the particle size thereof, as follows: the light absorptivity of light at a wavelength of 600 nm of the β-type sialon phosphor is preferably 6% or less. There is light at a wavelength of 600 nm as light at any wavelength not naturally absorbed by Eu as an activation element of the phosphor, as in the light at a wavelength of 800 nm, with respect to the β-type sialon phosphor. The degree of absorptivity of light at a wavelength of 600 nm may be evaluated to thereby confirm the degree of excessive light absorption by defects of the phosphor.

A pulverization treatment is not essential for production of the β-type sialon phosphor of the invention. However, it is considered that an excessively strong pulverization treatment is performed to thereby generate an ultrafine powder including many crystal defects more, resulting in a reduction in brightness, and thus any ultrafine powder low in characteristics may be removed to thereby provide high brightness and a high internal quantum efficiency. In such a case, whether or not the value of diffuse reflectivity of light at a wavelength of 800 nm is 95% or more serves as an index for fluorescent light-emitting characteristics of the β-type sialon phosphor of the invention. Whether or not the absorptivity of light at a wavelength of 600 nm is 6% or less, more preferably 5% or less also similarly serves as an index for fluorescent light-emitting characteristics of the β-type sialon phosphor of the invention.

In the β-type sialon phosphor of the invention, the average particle size $D_{BET}$ [μm] calculated from the specific surface area as measured according to a BET method and the D50 [μm] on a volume frequency basis as measured according to a laser diffraction/scattering method preferably satisfy a relationship of $D50/D_{BET}<2.1$.

For example, it is considered that any particle large in $D50/D_{BET}$ as the ratio of the D50 measured according to a laser diffraction/scattering method to the average particle size $D_{BET}$ calculated from the BET specific surface area, namely, any particle having a smaller average particle size $D_{BET}$ calculated from the BET specific surface area than the D50 measured according to a laser diffraction/scattering method, among particles having the same D50, is relatively large in BET specific surface area.

It is considered that such a particle may, for example, have a coarse particle surface, be in a state where the ultrafine powder is attached to or aggregated with a large particle, or be mutually aggregated. It is considered that many defects are present in the ultrafine powder due to pulverization and light-emitting characteristics such as internal quantum efficiency are low, and thus the value of $D50/D_{BET}$, which may suppose the presence of the ultrafine powder attached or aggregated, is preferably small. Accordingly, the value of $D50/D_{BET}$ in the β-type sialon phosphor of the invention is preferably less than 2.1.

Another embodiment of the invention provides a light-emitting device having a LED, a phosphor sheet, or a phosphor plate including the β-type sialon phosphor of the invention. A light-emitting device using the β-type sialon phosphor of the invention may realize high brightness.

EXAMPLES

Hereinafter, the invention will be described with reference to Examples and Comparative Examples. However, the phosphor of the invention is not intended to be limited by the contents of Examples described below.

Example 1

A β-type sialon phosphor of Example 1 was produced through each step described below in detail: a firing step of firing a raw material powder obtained by mixing starting materials, a low-temperature firing step (annealing step) to be performed after once formation of a powder of the fired product obtained in the firing step, an acid treatment step of removing impurities from a low-temperature fired powder obtained after the low-temperature firing step, and a decantation step of further removing an ultrafine powder from the powder after the acid treatment step.

Firing step A silicon nitride powder (SN-E10 grade manufactured by Ube Industries, Ltd.), an aluminum nitride powder (E grade manufactured by Tokuyama Corporation), an aluminum oxide powder (TM-DAR grade manufactured by Taimei Chemicals Co., Ltd.), and europium oxide (RU grade manufactured by Shin-Etsu Chemical Co., Ltd.) were compounded and mixed as starting materials of the phosphor of Example 1 so that the molar ratio of each element was Si:Al:O:Eu=5.83:0.18:0.18:0.03. The content of nitrogen was determined when such raw materials were compounded according to the above molar ratio. Such each starting material was mixed by a small-sized mill mixer in order to sufficiently disperse and mix such each starting material. Thereafter, all such starting materials were allowed to pass through a sieve having an aperture of 150 μm to remove any aggregated product, and the resultant was adopted as a raw material powder.

The raw material powder was packed in a cylindrical boron nitride container (Denka Company Limited) with a lid, and fired in an electrical furnace of a carbon heater at 1900° C. for 5 hours in a pressurized nitrogen atmosphere at 0.9 MPa, thereby obtaining a fired product.

Low-Temperature Firing Step (Annealing Step)

The fired product obtained in the firing step was pulverized with a wet ball mill (zirconia ball) for 2 hours as a preparation stage, thereafter filtered and dried, and allowed to pass through a sieve having a nominal aperture of 45 μm. The resultant was packed in a cylindrical boron nitride container, and retained in an electrical furnace equipped with a carbon heater at 1500° C. for 7 hours under an argon flow atmosphere at the atmospheric pressure, thereby obtaining a low-temperature fired powder.

Acid Treatment Step

The low-temperature fired powder was immersed in a mixed acid of hydrofluoric acid and nitric acid. Next, a heating treatment was performed at 60° C. or more for 3 hours. The low-temperature fired powder after the heating treatment was sufficiently washed with pure water and then dried, and further allowed to pass through a 45-μm sieve, thereby obtaining a powder after the acid treatment step. An oxygen-containing compound such as SiO generated by a side-reaction of the raw material powder was volatized in the firing step, resulting in a tendency to reduce the content of oxygen contained in the fired product obtained in the firing step as compared with the oxygen content contained in the raw material powder, and thus any compound (heterophase) other than the β-type sialon phosphor, including oxygen, aluminum, and/or europium not formed into a solid solution in the β-type sialon phosphor after firing was produced in some cases. The heterophase was mostly or partially dissolved and removed in the acid treatment step.

Decantation Step

A decantation step of removing a fine powder in a supernatant where the powder after the acid treatment step was being precipitated was performed in order to remove the ultrafine powder from the powder after the acid treatment step, and the resulting precipitated product was filtered and dried, and further allowed to pass through a sieve having an aperture of 45 μm, thereby finally obtaining a β-type sialon phosphor of Example 1. The decantation operation was performed by a method involving calculating the precipitation time of the phosphor particle according to the Stokes□ equation, with a setting for removal of any particle of 2 μm or less, and removing any supernatant located at a determined height or more at the same as reaching a predetermined time from the start of precipitation. An aqueous solution of 0.05% by weight of Na hexametaphosphate mixed in ion-exchange water was used as a dispersion medium, and an apparatus was used which was designed so that the supernatant was removed by suctioning any liquid located above a tube where a suction port was disposed at a predetermined height of a cylindrical container. The decantation operation was repeatedly performed.

Example 2

In production of a phosphor of Example 2, the firing temperature and the firing time in the firing step were 2000° C. and 18 hours, respectively, and furthermore the treatment time of the ball mill pulverization as a preparation stage of the low-temperature heat treatment step (annealing step) was 40 hours. The operations of other steps were forwarded in the same conditions as in Example 1, thereby obtaining a β-type sialon phosphor of Example 2.

Example 3

In production of a phosphor of Example 3, the operations were forwarded in the same conditions as in Example 1 except that the firing temperature in the firing step was 1960° C., thereby obtaining a β-type sialon phosphor of Example 3.

Comparative Example 1

In production of a phosphor of Comparative Example 1, removal of the ultrafine powder, filtration, drying, and sieving at 45 μm in the decantation step were not performed and a state where the ultrafine powder remained was maintained, and the operations of other steps were forwarded in the same conditions as in Example 1, thereby obtaining a β-type sialon phosphor of Comparative Example 1.

Comparative Example 2

In production of a phosphor of Comparative Example 2, the treatment time of the ball mill pulverization as a preparation stage of the low-temperature heat treatment step (annealing step) was 2 hours. The operations of other steps were forwarded in the same conditions as in Example 2, but ball mill pulverization according to a wet method was further performed for 40 hours after the decantation step, and filtration, drying, and sieving at 45 μm were performed, thereby obtaining a β-type sialon phosphor of Comparative Example 2.

Comparative Example 3

In production of a phosphor of Comparative Example 3, removal of the fine powder, filtration, drying, and sieving at 45 μm in the decantation step after the acid treatment step were not performed and a state where the ultrafine powder remained was maintained, and the operations of other steps were forwarded in the same conditions as in Example 2, thereby obtaining a β-type sialon phosphor of Comparative Example 3.

Example 4

In production of a phosphor of Example 4, ball mill pulverization according to a wet method was further performed for 2 hours after the decantation step. The operations of other steps were forwarded in the same conditions as in Comparative Example 2, thereby obtaining a β-type sialon phosphor of Example 4.

Comparative Example 4

In production of a phosphor of Comparative Example 4, the treatment time of the ball mill pulverization as a preparation stage of the low-temperature heat treatment step (annealing step) was 2 hours. The operations of other steps were forwarded in the same conditions as in Comparative Example 3, thereby obtaining a β-type sialon phosphor of Comparative Example 4.

Comparative Example 5

In production of a phosphor of Comparative Example 5, the operations until the acid treatment step were performed in the conditions of Comparative Example 4, and the subsequent decantation step was performed with setting for removal of any particle of 10 μm or less, thereby obtaining a β-type sialon phosphor of Comparative Example 5.

Example 5

In production of a phosphor of Example 5, the β-type sialon phosphor of Example 1 was further subjected to a pulverization treatment with a wet ball mill for 2 hours, filtration, drying, and a classification operation with a 45-μm sieve were performed, thereafter a decantation operation, filtration, and drying were conducted with setting for removal of any fine powder of 2 μm or less, and the resultant was allowed to pass through a 45-μm sieve, thereby obtaining a β-type sialon phosphor of Example 5.

Comparative Example 6

In production of a phosphor of Comparative Example 6, the treatments were performed in the same conditions as in Example 5, but the last decantation operation and subsequent treatments were not performed, thereby obtaining a β-type sialon phosphor of Comparative Example 6.

Example 6

A silicon nitride powder (SN-E10 grade manufactured by Ube Industries, Ltd.), an aluminum nitride powder (E grade manufactured by Tokuyama Corporation), an aluminum oxide powder (TM-DAR grade manufactured by Taimei Chemicals Co., Ltd.), and europium oxide (RU grade manufactured by Shin-Etsu Chemical Co., Ltd.) were compounded and mixed as starting materials of a phosphor of Example 6 so that the molar ratio of each element was Si:Al:O:Eu=5.97:0.03:0.03:0.013, the treatment time of the ball mill pulverization as a preparation stage of the low-temperature heat treatment step (annealing step) was 2 hours, and other treatments were performed in the same conditions as in Example 2, thereby obtaining a β-type sialon phosphor of Example 6.

Comparative Example 7

In production of a phosphor of Comparative Example 7, removal of the fine powder, filtration, drying, and the treatment for passing through a 45-μm sieve in the decantation step after the acid treatment step were not performed and a state where the ultrafine powder remained was maintained, and other steps were treated in the same conditions as in Example 6, thereby obtaining a β-type sialon phosphor of Comparative Example 7.

Example 7

A silicon nitride powder (SN-E10 grade manufactured by Ube Industries, Ltd.), an aluminum nitride powder (E grade manufactured by Tokuyama Corporation), an aluminum oxide powder (TM-DAR grade manufactured by Taimei Chemicals Co., Ltd.), and europium oxide (RU grade manufactured by Shin-Etsu Chemical Co., Ltd.) were compounded as starting materials of a phosphor of Example 7 so that the molar ratio of each element was Si:Al:O:Eu=5.90:0.10:0.10:0.02, and other steps were treated in the same conditions as in Example 1, thereby obtaining a β-type sialon phosphor of Example 7.

Comparative Example 8

In production of a phosphor of Comparative Example 8, removal of the fine powder, filtration, drying, and the treatment for passing through a 45-μm sieve in the decantation step after the acid treatment step were not performed and a state where the ultrafine powder remained was maintained, and other steps were treated in the same conditions as in Example 7, thereby obtaining a β-type sialon phosphor of Comparative Example 8.

Confirmation of Crystal Structure

The crystal structure of each of the samples of Examples and Comparative Examples was confirmed by a powder X-ray diffraction pattern with CuKα ray by use of an X-ray diffractometer (UltimaIV manufactured by Rigaku Corporation). As a result, the same diffraction pattern as that of a β-type sialon crystal was observed in the powder X-ray diffraction pattern of each of the samples obtained in Examples 1 to 7 and Comparative Examples 1 to 8, and such each sample was confirmed to be a β-type sialon phosphor.

<D10, D50, D90, D99, and D100 of β-Type Sialon Phosphor>

The particle sizes of D10, D50, D90, D99, and D100 of each of the β-type sialon phosphors of Examples and Comparative Examples were measured with Microtrac MT3300EXII (MicrotracBEL Corp.) as a particle size measurement apparatus according to a laser diffraction/scattering method. The measurement procedure was as follows: 0.5 g of a phosphor for measurement was loaded into 100 ml of an aqueous solution of 0.05% by weight of sodium hexametaphosphate mixed in ion-exchange water and subjected to a dispersing treatment for 3 minutes with an ultrasonic homogenizer, Ultrasonic Homogenizer US-150E (manufactured by Nippon Seiki Co., Ltd.) at an amplitude of 100%, an oscillation frequency of 19.5±1 kHz, a chip size of 20φ, and an amplitude of vibration of 32±2 μm, with a chip being placed at a central portion of a liquid, and the particle size was measured with the MT3300EXII. Each particle size (unit: [μm]) of D50, D10 as the particle size at a cumulative volume of 10% from a small particle size side, D90 as the particle size at a cumulative volume of 90% from a small particle size side, D99 as the particle size at a cumulative volume of 99%, D100 as the particle size at a cumulative volume of 100% was determined from a particle size distribution of each of the phosphors obtained.

Average Particle Size $D_{BET}$ of β-Type Sialon Phosphor

The average particle size $D_{BET}$ [μm] of each of the β-type sialon phosphors of Examples and Comparative Examples, as calculated from the specific surface area measured according to a BET method, may be calculated from the specific surface area by an air permeability method, according to the following expression:

$$D_{BET}=6/(V\times G)$$

wherein V represents the specific surface area [μm$^2$/g] of a measurement subject material, as determined according to an air permeability method, and G represents the density [g/μm$^3$] of the measurement subject material.

The BET specific surface area V of each of the β-type sialon phosphors of Examples and Comparative Examples was measured with a specific surface area measurement apparatus, HM model-1201 manufactured by Mountech Co., Ltd., according to JIS Z8830:2013. The method for measuring the amount of adsorption of gas and analysis of the adsorption data were according to section 6.3.4 (carrier gas method) of JIS Z8830 and section 7.3 (one point method) of JIS Z8830. Each sample was used in an amount of 2 g, and was subjected to a heating treatment in nitrogen at 300° C. for 20 minutes, degassed, and then cooled by liquid nitrogen, a mixed gas of nitrogen and helium at a volume ratio of 70:30 was allowed to adsorb thereto, thereafter the temperature was returned to ordinary temperature, and measurement was performed. The density G was measured with a density measurement apparatus, MAT-7000 (Seishin Enterprise Co., Ltd.).

Light Absorptivity at 455 nm, Internal Quantum Efficiency, External Quantum Efficiency, Chromaticity X, Peak Wavelength, and Half-Value Width The light absorptivity at 455 nm, the internal quantum efficiency, the external quantum efficiency, and the chromaticity X of each of the β-type sialon phosphors of Examples and Comparative Examples were calculated according to the following procedure.

In other words, each of the phosphors of Examples and Comparative Examples to be measured was packed in a concave cell so that the surface was smooth, and was attached to an opening of an integrating sphere. Monochromatic light at a wavelength of 455 nm, dispersed from a light-emitting source (Xe lamp), was introduced as excitation light of such each phosphor into the integrating sphere by use of an optical fiber. Such each phosphor specimen was irradiated with the monochromatic light, and a fluorescent spectrum of the specimen was measured with a spectrophotometer (MCPD-7000 manufactured by Otsuka Electronics Co., Ltd.). The number of photons of excitation reflection light (Qref) and the number of photons of fluorescence (Qem) were calculated from the resulting spectral data. The number of photons of excitation reflection light was measured in the same wavelength range as in the number of photons of excitation light, and the number of photons of fluorescence was measured in the range from 465 to 800 nm.

The same apparatus was again used, a standard reflector plate (Spectralon (registered trademark) manufactured by Labsphere, Inc.) having a reflectance of 99% was attached to an opening of an integrating sphere, and a spectrum of excitation light at a wavelength of 455 nm was measured. The number of photons of excitation light (Qex) was calculated from a spectrum in the wavelength range from 450 to 465 nm.

The light absorptivity at 455 nm and the internal quantum efficiency of each of the β-type sialon phosphors of Examples and Comparative Examples were determined according to the following calculation expressions.

Light absorptivity at 455 nm=$((Qex-Qref)/Qex)\times 100$

Internal quantum efficiency=$(Qem/(Qex-Qref))\times 100$

The external quantum efficiency was determined by the following calculation expression.

External quantum efficiency=$(Qem/Qex)\times 100$

Accordingly, the external quantum efficiency satisfied the following relationship from the above expressions.

External quantum efficiency=Light absorptivity at 455 nm×Internal quantum efficiency The chromaticity X of each of the β-type sialon phosphors of Examples and Comparative Examples was determined by calculating the value of CIE chromaticity coordinate x value (chromaticity X) in the XYZ color system prescribed by JIS Z8781-3:2016 according to JIS Z8724:2015, from the wavelength region data in the range from 465 nm to 780 nm of a fluorescent spectrum.

The peak wavelength of each of the β-type sialon phosphors of Examples and Comparative Examples was defined as the wavelength at which the highest intensity was exhibited in the range from 465 nm to 800 nm in a spectral data obtained by attaching such each phosphor to an opening of an integrating sphere.

The half-value width of each of the β-type sialon phosphors of Examples and Comparative Examples was defined as the difference in wavelength between a longer wavelength and a shorter wavelength at which the respective intensities were each half the intensity at the peak wavelength, in the spectrum appearing in the range from 465 nm to 800 nm in a spectral data obtained by attaching such each phosphor to an opening of an integrating sphere.

In a case where a standard specimen (NIMS Standard Green lot No. NSG1301, manufactured by Sialon Co., Ltd.) of each of the β-type sialon phosphors was subjected to measurement by the above measurement methods, the light absorptivity at 455 nm was 74.4%, the internal quantum efficiency was 74.8%, the external quantum efficiency was 55.6%, the chromaticity X was 0.356, the peak wavelength was 543 nm, and the half-value width was 53 nm. The respective measurement values of the light absorptivity at 455 nm, the internal and external quantum efficiencies, the chromaticity X, the peak wavelength, and the half-value width were varied in some cases due to the changes of manufactures, production lot numbers, and the like of the measurement apparatuses, and thus such respective measurement values were each corrected with the measurement value with respect to the standard specimen of the β-type sialon phosphor, as a standard value, in a case where manufactures, production lot numbers, and the like of the measurement apparatuses were changed.

Diffuse Reflectivity at 800 nm of β-Type Sialon Phosphor

The diffuse reflectivity of each of the β-type sialon phosphors of Examples and Comparative Examples was measured by attaching an integrating sphere apparatus □ISV-469□ to an ultraviolet/visible spectrophotometer □V -550□ manufactured by JASCO Corporation. Baseline correction was made by a standard reflector plate □Spectralon□ (registered trademark), a solid specimen holder where a phosphor powder was packed was attached, and the diffuse reflectivity was measured in the wavelength range from 500 to 850 nm. The diffuse reflectivity at 800 nm mentioned in the invention means particularly the value of diffuse reflectivity at 800 nm.

Light Absorptivity at 600 nm of β-Type Sialon Phosphor

The light absorptivity at 600 nm of each of the β-type sialon phosphors of Examples and Comparative Examples was measured according to the following procedure. In other words, a standard reflector plate □Spectralon□ (registered trademark) manufactured by Labsphere, Inc. having a reflectance of 99% was installed to an opening of an integrating sphere, monochromatic light at a wavelength of 600 nm, dispersed from a light-emitting source (Xe lamp), was introduced into the integrating sphere by use of an optical fiber, and a reflection light spectrum was measured with a spectrophotometer (□MCPD-7000□ manufactured by Otsuka Electronics Co., Ltd.). The number of photons of incident light ($Qex(600)$) was here calculated from the spectrum in the wavelength range from 590 to 610 nm.

Next, each of the β-type sialon phosphors was packed in a concave cell so that the surface was smooth, and was installed to an opening of an integrating sphere and thereafter was irradiated with monochromatic light at a wavelength of 600 nm, and an incident reflection light spectrum was measured with the spectrophotometer. The number of photons of incident reflection light ($Qref(600)$) was calculated from the resulting spectral data. The number of photons of incident reflection light ($Qref(600)$) was calculated in the same wavelength range as that with respect to the number of photons of incident light ($Qex(600)$). The light absorptivity at 600 nm was calculated from the resulting two numbers of photons according to the following expression.

Light absorptivity at 600 nm=$((Qex(600)-Qref(600))/Qex(600))\times 100$

In a case where a standard specimen (NIMS Standard Green lot No. NSG1301, manufactured by Sialon Co., Ltd.) of each of the β-type sialon phosphors was subjected to measurement by the above measurement methods, the light absorptivity at 600 nm was 7.6%. The light absorptivity at 600 nm was varied in some cases due to the changes of manufactures, production lot numbers, and the like of the measurement apparatuses, and thus the measurement value was corrected with the measurement value with respect to the standard specimen of the β-type sialon phosphor, as a standard value, in a case where manufactures, production lot numbers, and the like of the measurement apparatuses were changed.

Variations in Total Flux and Chromaticity Y with Evaluation of LED Package

Each of the β-type sialon phosphors and a silicone resin (□OE6656□ manufactured by Dow Corning Toray Co., Ltd.) were weighed so that the rate of such each β-type sialon phosphor was 3% by weight, and were mixed together by a planetary centrifugal mixer (□Awatori Rentaro (registered trademark) ARE-310□ manufactured by Thinky Corporation). Such each β-type sialon phosphor and the silicone resin were similarly taken so that the rate of such each β-type sialon phosphor was 5% by weight or 7% by weight, and were mixed together by the planetary centrifugal mixer. LED was mounted by placing the LED at the bottom of a concave package body, subjecting the resultant to wire bonding with an electrode on a substrate, and then injecting such each phosphor mixed with the silicone resin, through a microsyringe. After the mounting, the resultant was subjected to curing at 120° C. and then post-curing at 110° C. for 10 hours, and thus was sealed. The LED here used was one having a light-emitting peak wavelength of 448 nm and a chip size of 1.0 mm×0.5 mm. The LED package produced was subjected to measurements of the total flux and the chromaticity Y with a total flux measurement system. The method for comparing the total flux of each β-type sialon phosphor different in production conditions was made by creating the graph where the horizontal axis corresponded to the chromaticity Y and the vertical axis corresponded to the total flux, calculating the approximate curve with respect to such each β-type sialon phosphor different in production conditions, calculating the total flux at the same chromaticity Y, from the relational expression of the approximate curve, and defining the total flux of such each β-type sialon phosphor different in production conditions, as a relative value. Comparison with respect to the variation in chromaticity Y was made by producing 20 LEDs with the β-type sialon phosphor concentration being fixed, subjecting them to measurement with a total flux measurement system according to the method for measuring the chromaticity Y of the above LED, to take the standard deviation of the chromaticity Y, and defining the standard deviation as a relative value. When the standard deviation in the case of use of the β-type sialon phosphor of Example 1 was assumed to be 100% in comparison of the relative value of the standard deviation of the chromaticity Y, any β-type sialon phosphor where the relative value of the standard deviation was 123% or more was determined to be large in variation in chromaticity Y of the LED and any β-type sialon phosphor where the relative value of the standard deviation was less than 123% was determined to be small in variation in chromaticity Y of the LED.

The above respective results are shown in "Table 1-1" to "Table 1-4" below. The relative value of the total flux of the LED package was not measured in Example 3, Example 4, Comparative Example 4, and Comparative Example 5.

TABLE 1-1

|  |  | Example 1 | Comparative Example 1 | Example 2 | Comparative Example 2 | Comparative Example 3 | Example 3 | Example 4 | Comparative Example 4 | Comparative Example 5 |
|---|---|---|---|---|---|---|---|---|---|---|
| Production conditions | Firing temperature (° C.) | 1900 | 1900 | 2000 | 2000 | 2000 | 1960 | 2000 | 2000 | 2000 |
|  | Firing time (h) | 5 | 5 | 18 | 18 | 18 | 5 | 18 | 18 | 18 |
|  | Ball mill pulverization | 2 hours | 2 hours | 40 hours | 2 hours | 40 hours | 2 hours | 2 hours | 2 hours | 2 hours |
|  | Filtration/drying | Performed | Performed | Performed | Performed | Performed | Performed | Performed | Performed | Performed |

TABLE 1-1-continued

|  |  | Example 1 | Comparative Example 1 | Example 2 | Comparative Example 2 | Comparative Example 3 | Example 3 | Example 4 | Comparative Example 4 | Comparative Example 5 |
|---|---|---|---|---|---|---|---|---|---|---|
|  | Classification at 45 μm | Performed | Performed | Performed | Performed | Performed | Performed | Performed | Performed | Performed |
|  | Classification by sieve | 45 | 45 | 45 | 45 | 45 | 45 | 45 | 45 | 45 |
|  | Annealing temperature | 1500 | 1500 | 1500 | 1500 | 1500 | 1500 | 1500 | 1500 | 1500 |
|  | Annealing time | 7 | 7 | 7 | 7 | 7 | 7 | 7 | 7 | 7 |
|  | Acid treatment, filtration, washing with pure water | Performed | Performed | Performed | Performed | Performed | Performed | Performed | Performed | Performed |
|  | Filtration/drying | Performed | Performed | Performed | Performed | Performed | Performed | Performed | Performed | Performed |
|  | Classification at 45 μm | Performed | Performed | Performed | Performed | Performed | Performed | Performed | Performed | Performed |
|  | Removal of fine powder (removal of fine powder of 2 μm or less by decantation) | Performed | Not performed | Performed | Performed | Not performed | Performed | Performed | — | — |
|  | Removal of fine powder (removal of fine powder of 10 μm or less by decantation) | — | — | — | — | — | — | — | Not performed | Performed |
|  | Filtration/drying | Performed | — | Performed | Performed | — | Performed | Performed | — | Performed |
|  | Classification at 45 μm | Performed | — | Performed | Performed | — | Performed | Performed | — | Performed |
|  | Ball mill pulverization | — | — | — | 40 hours | — | — | 2 hours | — | — |
|  | Filtration/drying | — | — | — | Performed | — | — | Performed | — | — |
|  | Classification at 45 μm | — | — | — | Performed | — | — | Performed | — | — |
| Evaluations | (D90 − D10)/D50 | 1.35 | 1.64 | 1.33 | 1.61 | 1.61 | 1.31 | 1.39 | 1.62 | 1.34 |
|  | D10 (μm) | 2.5 | 1.1 | 2.5 | 1.3 | 1.4 | 3.4 | 3.5 | 5.739 | 7.303 |
|  | D50 (μm) | 4.0 | 3.6 | 4.3 | 4.4 | 4.1 | 7.1 | 8.8 | 12 | 15.02 |
|  | D90 (μm) | 7.9 | 7.0 | 8.2 | 8.4 | 8.0 | 12.7 | 15.7 | 25.13 | 27.4 |
|  | D99 (μm) | 15.1 | 15.0 | 17.6 | 18.1 | 17.6 | 30.1 | 37.3 | 61.8 | 63.2 |
|  | D100 (μm) | 21.9 | 21.9 | 26.0 | 26.0 | 26.0 | 36.8 | 43.7 | 73.58 | 73.6 |
|  | Diffuse reflectivity at 800 nm | 98.1 | 95.8 | 96.3 | 91.7 | 92.4 | 95.8 | 96.5 | 96.5 | 95.4 |
|  | Light absorptivity at 600 nm | 3.1 | 5.2 | 4.5 | 8.8 | 8.2 | 3.0 | 7.1 | 3.4 | 5 |
|  | BET specific surface area ($m^2/g$) | 0.72 | 1.03 | 0.68 | 0.94 | 0.97 | 0.54 | 0.42 | 0.36 | 0.21 |
|  | Real density ($g/cm^3$) | 3.25 | 3.25 | 3.25 | 3.25 | 3.25 | 3.25 | 3.25 | 3.25 | 3.25 |
|  | Average particle size ($D_{BET}$)(μm) | 2.56 | 1.79 | 2.72 | 1.96 | 1.90 | 3.42 | 4.40 | 5.13 | 8.79 |
|  | $D50/D_{BET}$ | 1.56 | 2.12 | 1.58 | 2.24 | 2.15 | 2.08 | 2.00 | 2.34 | 1.71 |
|  | Light absorptivity at 455 nm | 53.6 | 46.9 | 52.7 | 52.0 | 50.0 | 55.1 | 68.3 | 61.9 | 65.5 |
|  | Internal quantum efficiency | 86.5 | 75.2 | 77.3 | 71.6 | 75.0 | 80.3 | 76.5 | 84.1 | 81.1 |
|  | External quantum efficiency | 46.4 | 35.3 | 40.7 | 37.2 | 37.5 | 44.2 | 52.2 | 52.1 | 53.1 |
|  | Peak wavelength | 542 | 542 | 543 | 542 | 543 | 541 | 543 | 542 | 542 |
|  | Half-value width | 54 | 53 | 54 | 53 | 53 | 54 | 53 | 52 | 52 |
|  | Chromaticity X | 0.351 | 0.346 | 0.353 | 0.348 | 0.351 | 0.343 | 0.356 | 0.340 | 0.342 |
|  | Relative value of total flux of LED package | 100% | 96% | 99% | 98% | 97% | — | — | — | — |
|  | Variation in chromaticity Y of LED package | Small | Small | Small | Small | Small | Small | Small | Large | Large |

TABLE 1-2

|  |  | Example 5 | Comparative Example 6 |
|---|---|---|---|
| Production conditions | Firing temperature (° C.) | 1900 | 1900 |
|  | Firing time (h) | 5 | 5 |
|  | Ball mill pulverization | 2 hours | 2 hours |
|  | Filtration/drying | Performed | Performed |
|  | Classification at 45 μm | Performed | Performed |
|  | Classification by sieve | 45 | 45 |
|  | Annealing temperature | 1500 | 1500 |
|  | Annealing time | 7 | 7 |
|  | Acid treatment, filtration, washing with pure water | Performed | Performed |
|  | Filtration/drying | Performed | Performed |
|  | Classification at 45 μm | Performed | Performed |
|  | Removal of fine powder (removal of fine powder of 2 μm or less by decantation) | Performed | Performed |
|  | Removal of fine powder (removal of fine powder of 10 μm or less by decantation) | — | — |
|  | Filtration/drying | Performed | Performed |
|  | Classification at 45 μm | Performed | Performed |
|  | Ball mill pulverization | 2 hours | 2 hours |

TABLE 1-2-continued

|  |  | Example 5 | Comparative Example 6 |
|---|---|---|---|
|  | Filtration/drying | Performed | Performed |
|  | Classification at 45 μm | Performed | Performed |
|  | Removal of fine powder (removal of fine powder of 2 μm or less by decantation) | Performed | — |
|  | Filtration/drying | Performed | — |
|  | Classification at 45 μm | Performed | — |
| Evaluations | (D90 − D10)/D50 | 1.35 | 1.71 |
|  | D10 (μm) | 1.4 | 0.8 |
|  | D50 (μm) | 2.6 | 2.1 |
|  | D90 (μm) | 4.9 | 4.4 |
|  | D99 (μm) | 11.3 | 11.1 |
|  | D100 (μm) | 15.5 | 15.5 |
|  | Diffuse reflectivity at 800 nm | 95.2 | 91.5 |
|  | Light absorptivity at 600 nm | 5.2 | 10.6 |
|  | BET specific surface area ($m^2/g$) | 1.38 | 1.88 |
|  | Real density ($g/cm^3$) | 3.25 | 3.25 |
|  | Average particle size ($D_{BET}$)(μm) | 1.34 | 0.98 |
|  | $D50/D_{BET}$ | 1.94 | 2.14 |
|  | Light absorptivity at 455 nm | 46.6 | 43.0 |
|  | Internal quantum efficiency | 78.0 | 67.5 |
|  | External quantum efficiency | 36.3 | 29.0 |
|  | Peak wavelength | 542 | 543 |
|  | Half-value width | 53 | 52 |
|  | Chromaticity X | 0.343 | 0.342 |
|  | Relative value of total flux of LED package | 100% | 96% |
|  | Relative value of standard deviation of chromaticity Y of LED package | Small | Small |

TABLE 1-3

|  |  | Example 6 | Comparative Example 7 |
|---|---|---|---|
| Production conditions | Firing temperature (° C.) | 2000 | 2000 |
|  | Firing time (h) | 18 | 18 |
|  | Ball mill pulverization | 2 hours | 2 hours |
|  | Filtration/drying | Performed | Performed |
|  | Classification at 45 μm | Performed | Performed |
|  | Classification by sieve | 45 | 45 |
|  | Annealing temperature | 1500 | 1500 |
|  | Annealing time | 7 | 7 |
|  | Acid treatment, filtration, washing with pure water | Performed | Performed |
|  | Filtration/drying | Performed | Performed |
|  | Classification at 45 μm | Performed | Performed |
|  | Removal of fine powder (removal of fine powder of 2 μm or less by decantation) | Performed | Not performed |
|  | Removal of fine powder (removal of fine powder of 10 μm or less by decantation) | — | — |
|  | Filtration/drying | Performed | — |
|  | Classification at 45 μm | Performed | — |
|  | Ball mill pulverization | — | — |
|  | Filtration/drying | — | — |
|  | Classification at 45 μm | — | — |
|  | Removal of fine powder (removal of fine powder of 2 μm or less by decantation) | — | — |
|  | Filtration/drying | — | — |
|  | Classification at 45 μm | — | — |
| Evaluations | (D90 − D10)/D50 | 1.49 | 1.68 |
|  | D10 (μm) | 3.0 | 1.9 |
|  | D50 (μm) | 7.5 | 7.3 |
|  | D90 (μm) | 14.2 | 14.2 |
|  | D99 (μm) | 31.5 | 30.2 |
|  | D100 (μm) | 43.3 | 43.3 |
|  | Diffuse reflectivity at 800 nm | 98.5 | 92.3 |
|  | Light absorptivity at 600 nm | 3.0 | 10.2 |
|  | BET specific surface area ($m^2/g$) | 0.515 | 0.570 |
|  | Real density ($g/cm^3$) | 3.25 | 3.25 |
|  | Average particle size ($D_{BET}$)(μm) | 3.58 | 3.24 |
|  | $D50/D_{BET}$ | 2.09 | 2.25 |
|  | Light absorptivity at 455 nm | 48.0 | 44.0 |
|  | Internal quantum efficiency | 77.0 | 65.0 |
|  | External quantum efficiency | 37.0 | 28.6 |

TABLE 1-3-continued

|  | Example 6 | Comparative Example 7 |
|---|---|---|
| Peak wavelength | 529 | 529 |
| Half-value width | 47 | 47 |
| Chromaticity X | 0.279 | 0.28 |
| Relative value of total flux of LED package | 100% | 95% |
| Relative value of standard deviation of chromaticity Y of LED package | Small | Small |

TABLE 1-4

|  |  | Example 7 | Comparative Example 8 |
|---|---|---|---|
| Production conditions | Firing temperature (° C.) | 1900 | 1900 |
|  | Firing time (h) | 5 | 5 |
|  | Ball mill pulverization | 2 hours | 2 hours |
|  | Filtration/drying | Performed | Performed |
|  | Classification at 45 μm | Performed | Performed |
|  | Classification by sieve | 45 | 45 |
|  | Annealing temperature | 1500 | 1500 |
|  | Annealing time | 7 | 7 |
|  | Acid treatment, filtration, washing with pure water | Performed | Performed |
|  | Filtration/drying | Performed | Performed |
|  | Classification at 45 μm | Performed | Performed |
|  | Removal of fine powder (removal of fine powder of 2 μm or less by decantation) | Performed | Not performed |
|  | Removal of fine powder (removal of fine powder of 10 μm or less by decantation) | — | — |
|  | Filtration/drying | Performed | — |
|  | Classification at 45 μm | Performed | — |
|  | Ball mill pulverization | — | — |
|  | Filtration/drying | — | — |
|  | Classification at 45 μm | — | — |
|  | Removal of fine powder (removal of fine powder of 2 μm or less by decantation) | — | — |
|  | Filtration/drying | — | — |
|  | Classification at 45 μm | — | — |
| Evaluations | (D90 − D10)/D50 | 1.24 | 1.62 |
|  | D10 (μm) | 3.4 | 2.4 |
|  | D50 (μm) | 5.9 | 5.0 |
|  | D90 (μm) | 10.7 | 10.5 |
|  | D99 (μm) | 18.5 | 17.1 |
|  | D100 (μm) | 26.0 | 26.0 |
|  | Diffuse reflectivity at 800 nm | 95.1 | 89.9 |
|  | Light absorptivity at 600 nm | 5.1 | 7.7 |
|  | BET specific surface area (m²/g) | 0.650 | 0.810 |
|  | Real density (g/cm³) | 3.25 | 3.25 |
|  | Average particle size ($D_{BET}$)(μm) | 2.84 | 2.28 |
|  | $D50/D_{BET}$ | 2.08 | 2.19 |
|  | Light absorptivity at 455 nm | 55.6 | 54.3 |
|  | Internal quantum efficiency | 73.9 | 67.4 |
|  | External quantum efficiency | 41.1 | 36.6 |
|  | Peak wavelength | 539 | 539 |
|  | Half-value width | 55 | 55 |
|  | Chromaticity X | 0.334 | 0.333 |
|  | Relative value of total flux of LED package | 100% | 96% |
|  | Relative value of standard deviation of chromaticity Y of LED package | Small | Small |

The β-type sialon phosphor, in which the amount of a solid solution of Eu as an activator is large, reabsorbs a short wavelength component of fluorescence and allows light reabsorbed to be converted in wavelength and emit fluorescence, and thus is increased in chromaticity X due to long wavelength shift. In addition, a large amount of a solid solution of Eu tends to lead to an increased light absorptivity at 455 nm. Therefore, any Example and any Comparative Example which were close in chromaticity X were comparison targets in comparison of Examples and Comparative Examples. The light absorptivity at 455 nm depends on not only the amount of a solid solution of Eu, but also the particle size. This is based on the following: a small particle size leads to an increased specific surface area and a large effect of reflection and scattering, thereby resulting in a reduction in light absorptivity of light at a wavelength of 455 nm, as excitation light. Here, any Example and any Comparative Example which were close in the value of D50 were comparison targets. In other word, Table 1-1 to Table 1-4 each represented a combination of any Example and any Comparative Example which were close in chromaticity X and the value of D50, for comparison.

Discussion

First, in comparison of Example 1 and Comparative Example 1 in Table 1-1, Comparative Example 1 exhibited a smaller value of D10 and a larger value of (D90−D10)/D50, and the ultrafine powder was considered to be more present as compared with that of D50. The value of D50/$D_{BET}$ was also large. Comparative Example 1 exhibited a low internal quantum efficiency, and Example 1 where the ultrafine powder was removed exhibited a high internal quantum efficiency. Comparative Example 1 exhibited a high light absorptivity at 600 nm, and it was considered that defects, heterophase, and the like absorbing extra light other than that absorbed by Eu were present. Example 1 also exhibited a high diffuse reflectivity at 800 nm, and it was considered that there were few defects, heterophase, and the like absorbing extra light other than that absorbed by Eu. Example 1 also exhibited a high light absorptivity at 455 nm, and this was considered because the specific surface area was large and the ultrafine powder reflecting and scattering light was less present.

Example 2, when compared with Example 1, included firing at a high temperature and thus promotion of particle growth, and resulted in the synthesis of a phosphor having a large particle size, but resulted in a decrease in particle size due to ball mill pulverization for a long time and also resulted in a particle size distribution finally close to that of Example 1 due to removal of the ultrafine powder. While defects were increased by pulverization, such defects were able to be reduced in the low-temperature heat treatment step (annealing step), and a high internal quantum efficiency, a low light absorptivity at 600 nm, and a high diffuse reflectivity at 800 nm were able to be obtained as in Example 1.

In comparison of Example 2 with Comparative Example 3, Comparative Example 3 exhibited a small D10, a large (D90−D10)/D50, remaining of the ultrafine powder as compared with that of D50, also a large D50/$D_{BET}$, a low internal quantum efficiency, a high light absorptivity at 600 nm, a low diffuse reflectivity at 800 nm, large absorption of extra light by defects and the like, other than that absorbed by Eu, and furthermore a low light absorptivity at 455 nm. In comparison of Comparative Example 2 with Comparative Example 3, Comparative Example 2, where no treatments including the low-temperature heat treatment step (annealing step) were performed after the final ball mill pulverization, thus did not enable defects to be removed, exhibited a low internal quantum efficiency, a high light absorptivity at 600 nm, and a low diffuse reflectivity at 800 nm, and was considered to cause large absorption of light by defects, other than that absorbed by Eu.

Example 4, when compared with Comparative Example 2, exhibited a low pulverization strength, a high D10, also a small (D90−D10)/D50, less remaining of the ultrafine powder as compared with that of D50, also a small D50/$D_{BET}$, a high internal quantum efficiency, a relatively low light absorptivity at 600 nm, and a high diffuse reflectivity of light at 800 nm, and it was considered that absorption of extra light other than that absorbed by Eu was less.

In comparison of Comparative Example 4 with Comparative Example 5, Comparative Example 4, where no removal of the fine powder by decantation was performed, exhibited a high internal quantum efficiency, a low light absorptivity at 600 nm, and a high diffuse reflectivity at 800 nm, and it was considered that absorption of light by defects and the like, other than that absorbed by Eu, was less. This was considered because firing at a high temperature for a long time promoted particle growth and thus less pulverization was made by ball mill pulverization to result in a less increase of defects and the like in the vicinity of the surface due to pulverization. However, a D50 of more than 10 μm is not suitable for a micro LED, a mini LED, and a phosphor sheet. A micro LED has a size of 100 μm or less, and a phosphor layer of 50 μm or less is often installed. There is here a demand for favorable processability of a sheet having a thickness of 50 μm. Comparative Example 4 and Comparative Example 5, where any coarse particle was much present, exhibited inferior processability of a sheet having a thickness of 50 μm. Both Comparative Example 4 and Comparative Example 5 exhibited a large variation in chromaticity Y of the LED package.

In comparison of Comparative Example 5 with Comparative Example 4, while Comparative Example 5 corresponded to Comparative Example 4 from which the ultrafine powder was removed, Comparative Example 5 and Comparative Example 4 were almost equivalent in terms of external quantum efficiency (External quantum efficiency=Light absorptivity at 455 nm x Internal quantum efficiency). In the case of a D50 of more than 10 μm, the effect of enhancing quantum efficiency and absorptivity due to removal of the ultrafine powder was less exerted.

In comparison of Example 5 with Comparative Example 6 in Table 1-2, Example 5 exhibited a large D10, a small (D90−D10)/D50, less remaining of the ultrafine powder as compared with that of D50, also a small D50/$D_{BET}$, a high internal quantum efficiency, a low light absorptivity at 600 nm, a high diffuse reflectivity at 800 nm, and small absorption of extra light by defects and the like, other than that absorbed by Eu.

Example 6 and Comparative Example 7 in Table 1-3 provided β-type sialon phosphors changed in chemical composition and shortened in light-emitting peak wavelength. In comparison of Example 6 with Comparative Example 7, Example 6 exhibited a large D10, a small (D90−D10)/D50, less remaining of the ultrafine powder as compared with that of D50, also a small D50/$D_{BET}$, a high internal quantum efficiency, a low light absorptivity at 600 nm, a high diffuse reflectivity at 800 nm, and small absorption of extra light other than that absorbed by Eu.

In similar comparison of Example 7 with Comparative Example 8 in Table 1-4, Example 7 exhibited a large D10, a small (D90−D10)/D50, less remaining of the ultrafine powder as compared with that of D50, also a small D50/$D_{BET}$, a high in internal quantum efficiency, a low light absorptivity at 600 nm, a high diffuse reflectivity at 800 nm, and small absorption of extra light other than that absorbed by Eu.

INDUSTRIAL APPLICABILITY

The phosphor of the invention, and a phosphor and a light-emitting device produced according to the production method of the invention are each used for a white light-emitting device and a colored light-emitting device. The white light-emitting device of the invention is used for a liquid crystal display, a micro LED display, a mini LED display, a backlight of a liquid crystal panel, a lighting device, a signal device, and an image display device. It is also used in a projector application.

Furthermore, each embodiment of the invention provides a phosphor which may be used in a small-sized LED, and thin phosphor sheet and phosphor plate, and which is high in brightness and small in particle size. A small particle size leads to an improvement in dispersibility in a resin, and a reduction in the variation of coarseness and denseness in a resin. A phosphor sheet and a phosphor plate are also decreased in surface roughness. Furthermore, the phosphor is decreased in particle size to thereby allow for production of a phosphor sheet having a thickness of about several tens μm, production of a LED having a size of about several tens μm, and coating through a nozzle or a screen printing mesh having an inner diameter of several tens μm. A yield of a small-sized LED package is also raised.

The invention claimed is:

1. A β-type sialon phosphor represented by the following expression 1, wherein D50 is 4.3 μm or less, and values of D10, D50, and D90 satisfy a relationship of the following expression 2 with respect to D10, D50, and D90 (each unit is [μm]) on a volume frequency basis as measured according to a laser diffraction/scattering method:

$$Si_{12-a}Al_aO_bN_{16-b}:Eu_x \qquad \text{Expression 1}$$

where $0<a\leq3$; $0<b\leq3$; $0<x\leq0.1$ $$(D90-D10)/D50<1.6 \qquad \text{Expression 2}$$

where the D10, D50, and D90 (each unit is [μm]) on a volume frequency basis as measured according to the laser diffraction/scattering method are each a measurement value obtained with a liquid obtained by loading 0.5 g of a phosphor for measurement, into 100 ml of a solution of 0.05% by weight of sodium hexametaphosphate mixed in ion-exchange water, and subjecting the resultant to a dispersing treatment for 3 minutes with an ultrasonic homogenizer at an oscillation frequency of 19.5±1 kHz and an amplitude of vibration of 32±2 μm, with a chip being placed at a central portion of the liquid, and an average particle size $D_{BET}$ [μm] calculated from a specific surface area measured according to a BET method and the D50 [μm] measured according to a laser diffraction/scattering method, of the β-type sialon phosphor, satisfy a relationship of the following expression 3:

$$D50/D_{BET}<2.1. \qquad \text{Expression 3}$$

2. The β-type sialon phosphor according to claim 1, wherein a diffuse reflectivity of light at a wavelength of 800 nm is 95% or more.

3. The β-type sialon phosphor according to claim 1, wherein a light absorptivity of light at a wavelength of 600 nm is 6% or less.

4. A light-emitting device comprising a LED, a phosphor sheet, or a phosphor plate comprising the β-type sialon phosphor according to claim 1.

* * * * *